US012684915B2

(12) United States Patent
Okuyama et al.

(10) Patent No.: US 12,684,915 B2
(45) Date of Patent: Jul. 14, 2026

(54) LIGHT EMITTING DEVICE, SURFACE LIGHT SOURCE DEVICE, AND DISPLAY DEVICE

(71) Applicant: Enplas Corporation, Kawaguchi (JP)

(72) Inventors: Hiroaki Okuyama, Saitama (JP); Masaki Nogami, Saitama (JP); Takuro Momoi, Saitama (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 19/206,090

(22) Filed: May 13, 2025

(65) Prior Publication Data

US 2025/0359402 A1 Nov. 20, 2025

(30) Foreign Application Priority Data

May 17, 2024 (JP) ................................. 2024-080972

(51) Int. Cl.
 *H10H 20/855* (2025.01)
 *G02F 1/1335* (2006.01)
 *G02F 1/13357* (2006.01)

(52) U.S. Cl.
 CPC ..... *H10H 20/855* (2025.01); *G02F 1/133603* (2013.01); *G02F 1/133607* (2021.01)

(58) Field of Classification Search
 CPC ............ H10H 20/855; G02F 1/133603; G02F 1/133607; F21V 7/0091; F21V 5/04; F21V 5/046
 See application file for complete search history.

(56) References Cited

U.S. PATENT DOCUMENTS

| | | | | |
|---|---|---|---|---|
| 2006/0238884 A1* | 10/2006 | Jang | .................. | G02B 19/0066 257/E33.073 |
| 2013/0088857 A1* | 4/2013 | Lee | .................. | G02B 19/0061 362/311.01 |
| 2014/0226311 A1 | 8/2014 | Ono | | |
| 2015/0378215 A1* | 12/2015 | Tran | ....................... | G02B 17/00 362/97.3 |
| 2021/0293396 A1* | 9/2021 | Momoi | .................. | F21V 5/046 |

FOREIGN PATENT DOCUMENTS

| | | | | | |
|---|---|---|---|---|---|
| CN | 202927738 U | * | 5/2013 | | |
| CN | 103471009 A | * | 12/2013 | ......... | G02B 19/0028 |
| JP | 2015095276 A | * | 5/2015 | .......... | G02F 1/0105 |
| WO | WO-2013055020 A1 | * | 4/2013 | .......... | H10H 20/855 |

* cited by examiner

*Primary Examiner* — Erin Kryukova
(74) *Attorney, Agent, or Firm* — Amin, Turocy & Watson, LLP

(57) ABSTRACT

A light emitting device of the present invention is a light emitting device including a light emitting element and a light flux controlling member for controlling light from the light emitting element. The light flux controlling member includes an incidence surface, a total reflecting surface, and an emission surface. In a light distribution curve indicating a far-field light distribution of the light emitting device, when an integral value of a luminous intensity in a range of 0° to 180° is A, and an integral value of a luminous intensity in a range of 83° to 97° is a1, a1/A is from 0.23 to 0.38.

7 Claims, 9 Drawing Sheets

EXAMPLE

COMPARATIVE EXAMPLE 1

COMPARATIVE EXAMPLE 2

LIGHT EMITTING DEVICE, SURFACE LIGHT SOURCE DEVICE, AND DISPLAY DEVICE

CROSS REFERENCE TO RELATED APPLICATIONS

This application is entitled to and claims the benefit of Japanese Patent Application No. 2024-80972, filed on May 17, 2024, the disclosure of which including the specification, drawings and abstract is incorporated herein by reference in its entirety.

TECHNICAL FIELD

The present invention relates to a light emitting device, a surface light source device, and a display device.

BACKGROUND ART

A surface light source devices used in a display device such as a liquid crystal display is known. The surface light source device includes a plurality of light emitting devices, and light from the plurality of light emitting devices reaches a light diffusion plate and is diffused to obtain surface light. The surface light source device functions as a surface light source in a liquid crystal display device. For example, PTL 1 discloses such a surface light source device.

CITATION LIST

Patent Literature

PTL 1
US Patent Application Publication No. 2014/0226311

SUMMARY OF INVENTION

Technical Problem

FIG. 1A illustrates a cross-sectional view of surface light source device 10 as described above. As illustrated in FIG. 1A, surface light source device 10 includes a plurality of light emitting devices 20 and light diffusion plate 30. In the cross-sectional view of FIG. 1A, substrate 31, on which light emitting devices 20 are disposed, and light diffusion plate 30 are illustrated as a cross-sectional view, but light emitting device 20 is illustrated as a side view. In addition, hatching in the cross section is omitted. Light emitting device 20 includes light emitting element 21, namely a light source, and light flux controlling member (lens) 22, namely a refractive lens for controlling light from light emitting element 21. Light from light emitting element 21 has its light distribution controlled by the light flux controlling member 22 and reaches light diffusion plate 30 to be diffused, and surface light source device 10 functions as a surface light source.

Such surface light source device 10 may be required to reduce the number of light emitting devices 20 for cost reduction. Therefore, for example, it is assumed that light emitting device 20 in the middle of the three arranged light emitting device 20 is removed as illustrated in FIG. 1B. In this case, a dark part would be generated in the portion of light diffusion plate 30 corresponding to light emitting device 20 that has been removed.

Therefore, in order to prevent the generation of dark parts, it is conceivable to enlarge light flux controlling member 22, which is a refractive lens, so as to expand the light further. However, in this way, the material used for the light flux controlling member 22 increases, thereby increasing the cost. Therefore, the present inventors have attempted to use, as a light flux controlling member, light emitting device 40 including light flux controlling member (reflection lens) 42 that includes total reflecting surface 41 and easily expands light as illustrated in FIG. 1C.

However, when light flux controlling member 42 including total reflecting surface 41 is used, light from light emitting device 40 may reach a portion above the adjacent light emitting device 40 as illustrated in FIG. 1C. In such a case, for example, in surface light source device 10 of FIG. 1C, when it is desired to express light and dark contrast on a display device using surface light source device 10 by turning off light emitting device 40 on the left and turning on light emitting device 40 on the right, appropriate light and dark contrast may not be obtained. That is, satisfactory local dimming performance may not be achieved.

An object of the present invention is to provide a light emitting device that is easy to obtain a satisfactory light and dark contrast with a dark part prominent above a turned-off light emitting device, a surface light source device including the light emitting device, and a display device including the surface light source device.

Solution to Problem

The present invention relates to the following light emitting device, surface light source device, and a display device.

[1] A light emitting device comprising a light emitting element and a light flux controlling member for controlling light from the light emitting element, in which the light flux controlling member includes: an incidence surface for allowing incidence of the light from the light emitting element, the incidence surface being disposed to face a light emitting surface of the light emitting element, a total reflecting surface for totally reflecting, in a direction away from an optical axis of the light emitting element, the light incident on the incidence surface, and an emission surface for emitting the light reflected by the total reflecting surface, and
in a light distribution curve indicating a far-field light distribution of the light emitting device, when an angle of a direction along the optical axis is 0°, an integral value of a luminous intensity in a range of 0° to 180° is A, and an integral value of a luminous intensity in a range of 83° to 97° is a1, a1/A is from 0.23 to 0.38.

[2] The light emitting device according to [1], in which, in the light distribution curve, when an integral value of a luminous intensity in a range of 0° to 80° is a2, a2/A is 0.60 or less.

[3] The light emitting device according to [1] or [2], in which, in the light distribution curve, when an integral value of a luminous intensity in a range of 110° to 180° is a3, a3/A is 0.40 or less.

[4] The 1 Light emitting device according to any one of [1] to [3], in which at least a portion of light emitted at an angle of 30° to 50° with respect to the optical axis from a light emitting center of the light emitting element is reflected by the total reflecting surface so that an angle of the reflected portion with respect to the optical axis is 90° or more.

[5] A surface light source device, including: a substrate; a plurality of light emitting devices disposed on the substrate; and a light diffusion plate for diffusing light from the plurality of light emitting devices, in which the plurality of light emitting devices include the light emitting device any one of [1] to [4].

[6] The surface light source device according to [5], in which, when a distance between the substrate and the light diffusion plate is H, and a center-to-center distance between adjacent light emitting devices among the plurality of light emitting devices is P, His more than 7 mm, and H/P is 0.15 to 0.25.

[7] A display device including the surface light source device according to [5] or [6].

Advantageous Effects of Invention

According to the present invention, it is possible to provide a light emitting device that is easy to obtain a satisfactory light and dark contrast with a dark part prominent above a turned-off light emitting device, a surface light source device including the light emitting device, and a display device including the surface light source device.

DESCRIPTION OF EMBODIMENTS

Hereinafter, an embodiment of the present invention will be described in detail with reference to the drawings. In the following description, as a typical example of a surface light source device according to the present invention, a surface light source device suitable for backlight or the like of the liquid crystal display device (see FIG. 2A) will be described. The surface light source device can be used as a light source for display device 100' (e.g., a liquid crystal display device) by combining the surface light source device with display member 102 (e.g., a liquid crystal panel) that is irradiated with light from the surface light source device (see FIG. 2B).

EMBODIMENT (Configuration of Surface Light Source Device)

Figure 2A:
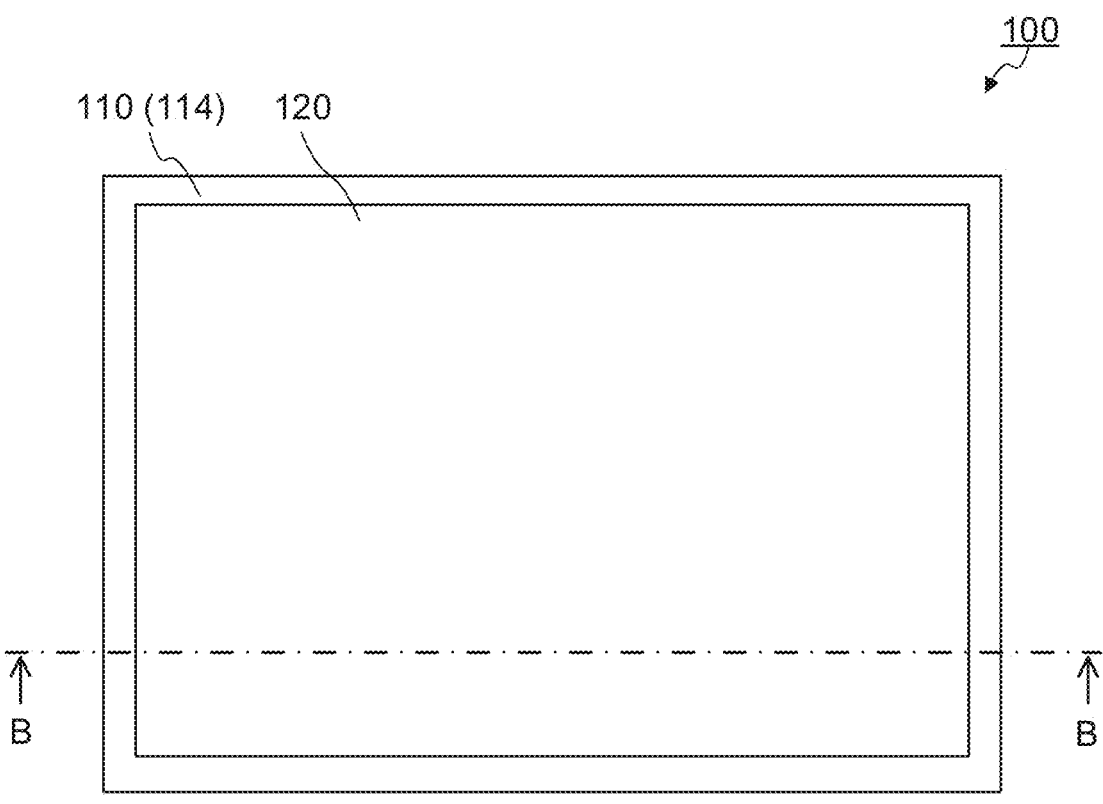
FIGS. 2A and 2B illustrate a surface light source device according to an embodiment.
Figure 2B:
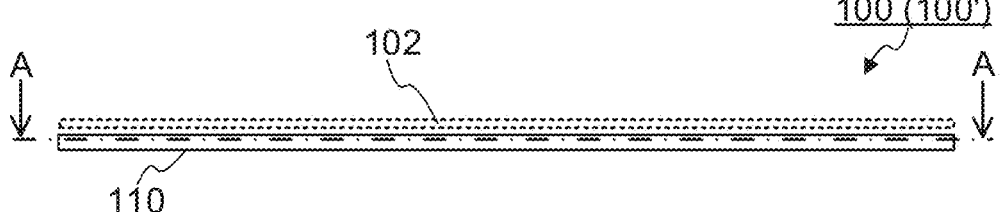
Figure 3A:
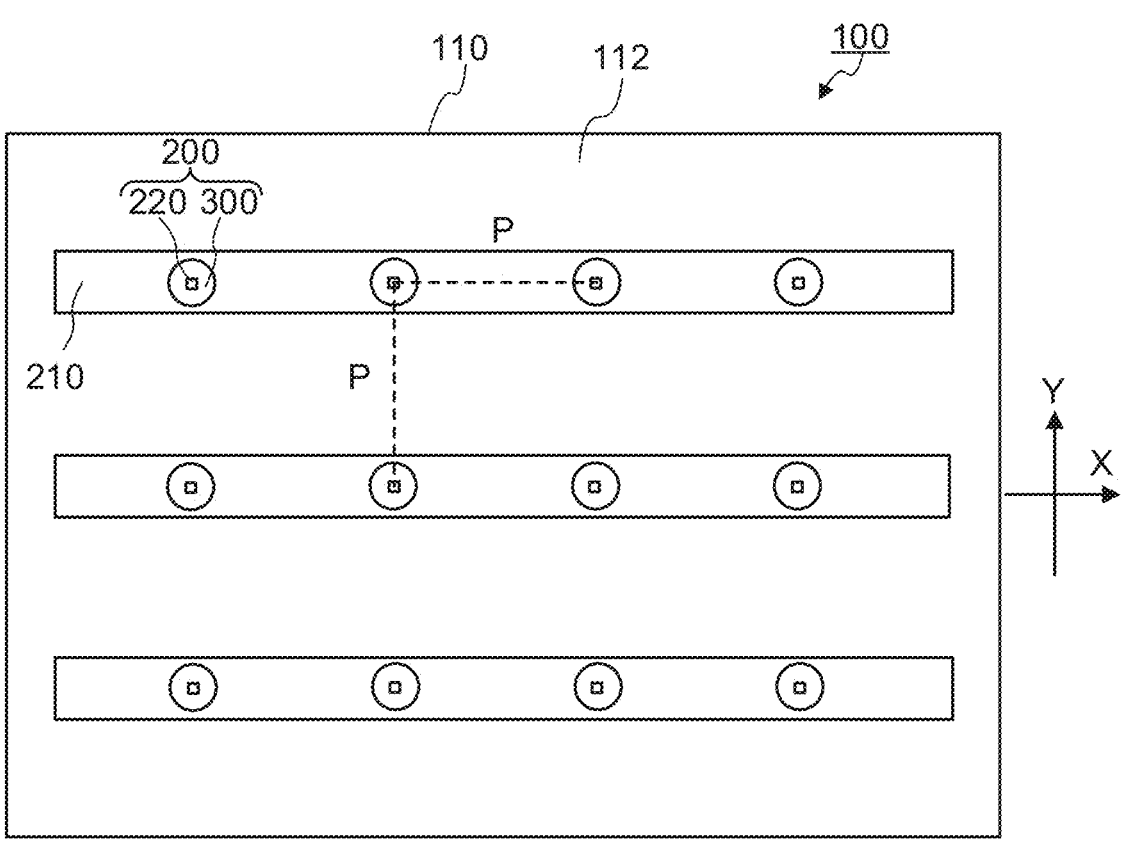
FIGS. 3A and 3B are cross-sectional views of the surface light source device according to the embodiment.
Figure 3B:
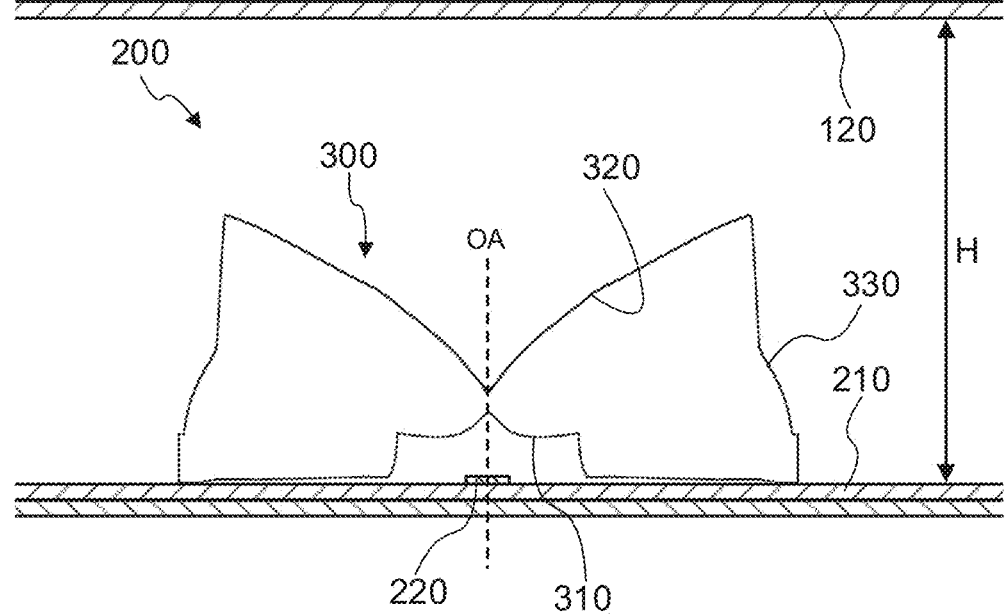

FIGS. 2A and 2B illustrate a configuration of surface light source device 100 according to the embodiment of the present invention. FIG. 2A is a plan view of surface light source device 100 and FIG. 2B is a front view thereof. FIGS. 3A and 3B are cross-sectional views of surface light source device 100. FIG. 3A is a schematic cross-sectional view taken along line A-A in FIG. 2B, and FIG. 3B is a partially enlarged cross-sectional view taken along line B-B in FIG. 2A. In FIG. 3B, the hatching of light flux controlling member 300 is omitted, showing only the external shape lines illustrated on the cross section. FIG. 3A illustrates a schematic disposition of the plurality of light emitting devices 200 in surface light source device 100, and FIG. 3B illustrates a schematic configuration of light emitting device 200 in a cross-sectional view.

As illustrated in FIGS. 2A to 3B, surface light source device 100 according to the present embodiment includes housing 110 in which a plurality of light emitting devices 200 are disposed, the plurality of light emitting devices 200 disposed in housing 110, and light diffusion plate 120 for diffusing light from light emitting devices 200. As illustrated in FIG. 3A, the plurality of light emitting devices 200 are disposed on bottom plate 112 of housing 110. The inner surface of bottom plate 112 functions as a diffusive reflecting surface and reflects light from light emitting device 200. Top plate 114 of housing 110 is provided with an opening. Light diffusion plate 120 is disposed to close the opening, and functions as a light emitting surface. The light emitting surface may have any size which is, for example, about 400 mm×about 700 mm.

As illustrated in FIG. 3A, in the present embodiment, light emitting device 200 is fixed on substrate 210 which is fixed at a predetermined position on bottom plate 112 of housing 110. In the present embodiment, substrate 210 is bar-shaped. Light emitting device 200 includes light flux controlling member 300 (lens) for controlling the light distribution of the light from light emitting element 220. Light emitting element 220 is disposed below light flux controlling member 300 and therefore cannot be seen in reality, but light emitting element 220 is illustrated in FIG. 3A for the purpose of explanation.

As illustrated in FIG. 3A, the plurality of light emitting devices 200 in the present embodiment are arranged in a row at equal intervals in the X direction, and are also arranged in a row at equal intervals in the Y direction perpendicular to the X direction. Further, in the present embodiment, the interval (center-to-center distance) between light emitting devices arranged to be adjacent to each other in the X direction is the same as the interval (center-to-center distance P) between light emitting devices arranged to be adjacent to each other in the Y direction.

FIG. 3B is a cross-sectional view of light emitting device 200 illustrated in FIG. 3A. As illustrated in FIG. 3B, in light emitting device 200, light flux controlling member 300 (lens) is disposed on light emitting element 220.

As illustrated in FIG. 3A, the center-to-center distance between the adjacent light emitting devices 200 is P, and as illustrated in FIG. 3B, the distance between the surface (substrate 210) on which light emitting device 200 is disposed and the back surface of light diffusion plate 120 is H. At this time, from the viewpoint of obtaining satisfactory light and dark contrast, and from the viewpoint of reducing the generation of uneven luminance even when H is changed due to, for example, bending of the light diffusion plate, it is preferable that H>7 and H/P is 0.15 to 0.25. By satisfying the above H/P, even when center-to-center distance P is large in the surface light source device, it is easy to obtain a satisfactory light and dark contrast. Further, by satisfying the above condition for H, even when H is slightly changed due to, for example, bending of light diffusion plate 120, it is possible to reduce a large change in unevenness of brightness on light diffusion plate 120 and adverse effects on the quality of the light emitting surface.

Light flux controlling member 300 includes incidence surface 310 for allowing incident of light emitted from light emitting element 220, total reflecting surface 320 for totally reflecting the light incident on incidence surface 310, and emission surface 330 for emitting light reflected by total reflecting surface 320. Details of the configuration of light flux controlling member 300 will be described below.

Figure 4A:
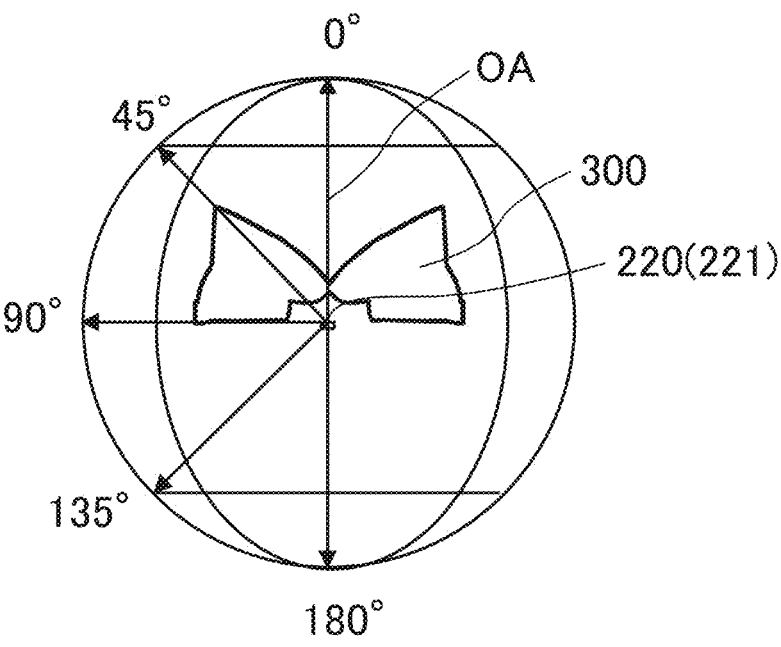
FIG. 4A is a diagram for explaining a simulation of a light distribution.
Figure 4B:
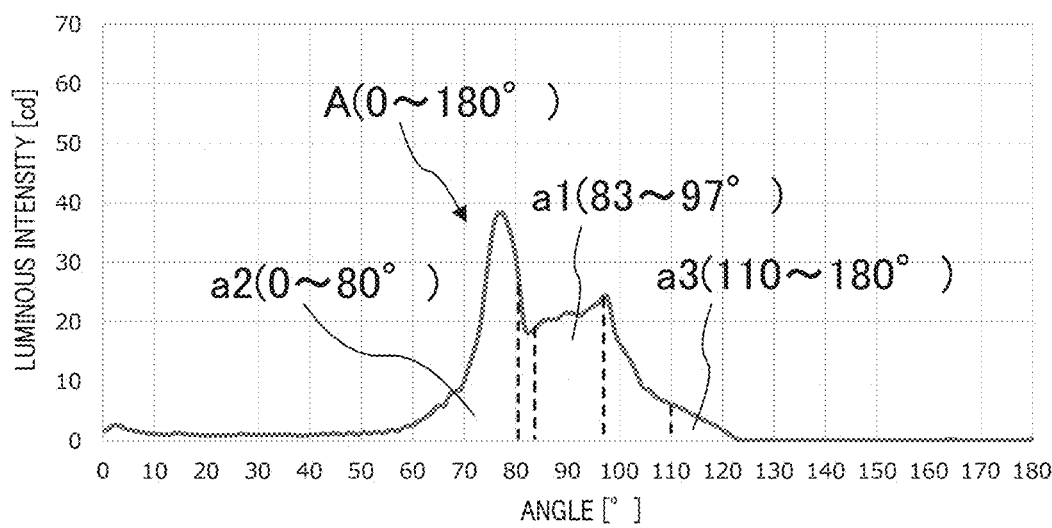
FIG. 4B is a graph illustrating a light distribution curve of the light emitting device according to the embodiment.

FIG. 4A is a diagram for explaining a simulation of a light distribution obtained by control using light flux controlling member 300 as described above. FIG. 4B illustrates the light distribution curve obtained by the simulation.

As illustrated in FIG. 4A, in the simulation, the angle of the direction along optical axis OA of light emitting element 220 is 0°. Then, in a hemisphere disposed in the far field around the light emitting center of light emitting surface 221 of light emitting element 220 as illustrated in FIG. 4A, light emitted from light emitting element 220 and controlled by light flux controlling member 300 is received, and a light distribution curve as illustrated in FIG. 4B showing the relationship between angle and luminous intensity is obtained. The integral value of the luminous intensity is A, and the integral value of the luminous intensity in the range of 83° to 97° is a1. At this time, when a1/A is 0.23 to 0.38, satisfactory light and dark contrast is obtained. Hereinafter, this will be referred to as condition 1 where appropriate.

Further, from the viewpoint of expanding the light (preventing the generation of a bright part directly above a turned-on light emitting device 200 (light emitting element 220)), the following is preferable. That is, in the light distribution curve, when the integral value of the luminous intensity simulated in units of 0.1° in the range of 0° to 80° is a2, a2/A is preferably 0.60 or less, as illustrated in FIG. 4B. Further, a2/A is preferably 0.15 or more in order to prevent the vicinity directly above the turned-on light emitting element becomes a dark part. Hereinafter, this is referred to as condition 2 as appropriate. Further, as illustrated in FIG. 4B, in the light distribution curve, when the integral value of the luminous intensity in the range of 110° to 180° is a3, a3/A is preferably 0.40 or less. Hereinafter, this is referred to as condition 3 as appropriate. These details will be described below while showing the simulation.

Each configuration of light emitting device 200 will be described below.

(Light Emitting Element)

Light emitting element 220 is a light source of surface light source device 100 and is mounted on substrate 210. Light emitting element 220 is a light emitting diode (LED), such as a white light emitting diode. Further, light emitting element 220 includes a light emitting surface 221 on the upper surface thereof. With this configuration, light emitting element 220 emits light from the upper surface. In the present embodiment, the light emitting surface is circular.

Light emitting element 220 includes optical axis OA. Optical axis OA is the center of the entire light emitted radially. In the present embodiment, optical axis OA of light emitting element 220 is a straight line that passes through the center of the light emitting surface and is perpendicular to the light emitting surface.

Light emitting element 220 is disposed within incidence surface 310 in such a way that light emitted from light emitting element 220 is incident on incidence surface 310 of light flux controlling member 300. In the present embodiment, there is air between light emitting element 220 and incidence surface 310.

(Light Flux Controlling Member)

Figures 5A, 5B:
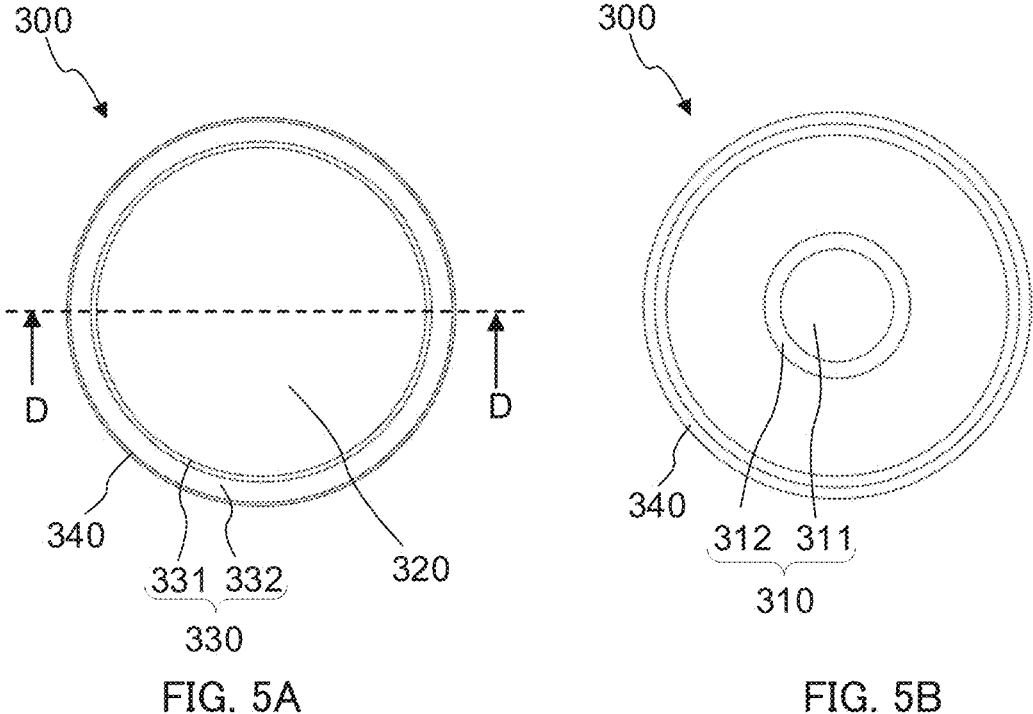
FIGS. 5A to 5D illustrate a light flux controlling member according to the embodiment.
Figures 5C, 5D:
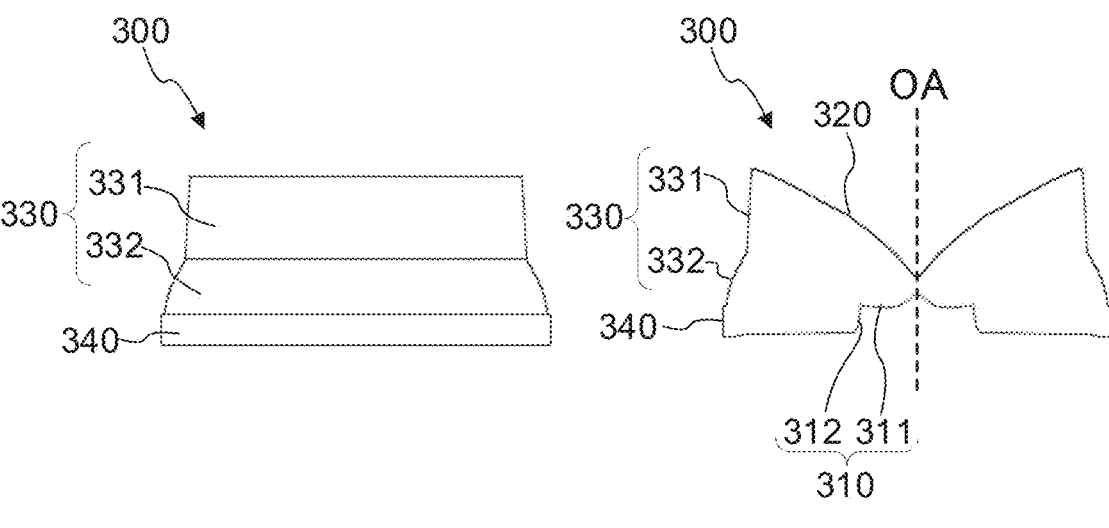

FIG. 5A is a plan view of light flux controlling member 300, FIG. 5B is a bottom view thereof, FIG. 5C is a side view thereof, and FIG. 5D is a cross-sectional view taken along line D-D in FIG. 5A and illustrates a cross section including optical axis OA. In FIG. 5D, hatching is omitted, showing only the external shape lines illustrated on the cross section.

Light flux controlling member 300 is an optical member for controlling the light distribution of light emitted from light emitting element 220. Light flux controlling member 300 is disposed on substrate 210. Light flux controlling member 300 is, for example, bonded to substrate 210. Light flux controlling member 300 has a shape that is rotationally symmetric (circularly symmetric) about optical axis OA. The outer shape of light flux controlling member 300 is a substantially disk-shaped, and circular when viewed in plan view and bottom view. The refractive index of light flux controlling member 300 may be, for example, 1.4 to 1.6. In the present embodiment, light flux controlling member 300 includes incidence surface 310, total reflecting surface 320, emission surface 330, and flange 340. These configurations also have a shape that is rotationally symmetric (circularly symmetric) about optical axis OA. Hereinafter, each configuration will be described.

<Incidence Surface>

Incidence surface 310 is disposed on the back side of light flux controlling member 300. More specifically, incidence surface 310 is disposed to face light emitting surface 221 of light emitting element 220. Further, incidence surface 310 is disposed on the back side of light flux controlling member 300 so as to intersect optical axis OA of light emitting element 220. Incidence surface 310 is an inner surface of the recess where light emitting element 220 is disposed.

In the present embodiment, incidence surface 310 includes first incidence surface 311 and second incidence surface 312.

First incidence surface 311 intersects optical axis OA, is closer to optical axis OA than second incidence surface 312 is, and is disposed at a position higher than second incidence surface 312 (position farther from substrate 210). First incidence surface 311 is a surface that has a larger angle with respect to optical axis OA than second incidence surface 312 and has a portion that is substantially perpendicular to the optical axis OA. Specifically, in the present embodiment, first incidence surface 311 is a curved surface whose tangent changes from nearly parallel to the optical axis OA to nearly perpendicular as the distance from optical axis OA to the surface increases. First incidence surface 311 is a surface onto which light among the light emitted from light emitting element 220—having a small angle with respect to optical axis OA is incident. First incidence surface 311 is a convex surface with respect to the light.

Second incidence surface 312 is a surface disposed outside first incidence surface 311. First incidence surface 311 and second incidence surface 312 are continuous. Second incidence surface 312 is a surface generally parallel to optical axis OA. Second incidence surface 312 is a surface onto which light having a large angle with respect to optical axis OA is incident. Second incidence surface 312 is a convex surface with respect to the light.

<Total Reflecting Surface>

Total reflecting surface 320 is disposed on the front side of light flux controlling member 300, and is a surface for totally reflecting the light incident on incidence surface 310 in a direction away from optical axis OA.

Total reflecting surface 320 includes a curved surface whose tangent slope approaches parallel to substrate 210 as the distance from optical axis OA to the surface increases, as illustrated in FIG. 5D. Further, total reflecting surface 320 is a curved surface configured to be away from substrate 210 as the distance from optical axis OA to the surface increases. Total reflecting surface 320 is formed to totally reflect incident light in a direction away from optical axis OA. Further, total reflecting surface 320 is an inner surface of the recess formed on the front side of light flux controlling member 300, and a portion of the incident light reaches total reflecting surface 320 and is reflected, and travels inside light flux controlling member 300.

As illustrated in FIG. 5A, total reflecting surface 320 is circular when light flux controlling member 300 is viewed in plan view, and is located on the innermost side.

<Emission Surface>

Emission surface 330 is a surface for emitting light reflected by total reflecting surface 320 to the outside of light flux controlling member 300. Further, emission surface 330 is a surface for emitting light that is incident on incidence surface 310 (second incidence surface 312) and does not pass through total reflecting surface 320. Emission surface 330 is disposed at a position corresponding to the side surface of light flux controlling member 300. Emission surface 330 includes first emission surface 331 and second emission surface 332. Emission surface 330 (first emission surface 331) is continuous with total reflecting surface 320. Further, emission surface 330 is disposed outside total reflecting surface 320 when light flux controlling member 300 is viewed in plan view, as illustrated in FIG. 5A.

First emission surface 331 is a surface closer to optical axis OA than second emission surface 332 is, and disposed at a higher position than the second emission surface. First emission surface 331 is continuous with total reflecting surface 320. First emission surface 331 is a surface substantially parallel to optical axis OA. The first emission surface is a concave surface that is more gently concave with respect to emitted light than the second emission surface.

Second emission surface 332 is a surface farther from the optical axis OA than first emission surface 331 is, and is disposed at a lower position than the first emission surface. First emission surface 331 and second emission surface 332 are continuous. Second emission surface 332 is a curved surface whose tangent approaches parallel to optical axis OA as the distance from optical axis OA to the surface increases. Second emission surface 332 is a concave surface with respect to the emitted light.

<Flange>

Flange 340 has a structure that protrudes most outwardly from the lowermost part of light flux controlling member 300. Flange 340 is continuous with emission surface 330 (second emission surface 332). Further, flange 340 is disposed outside emission surface 330 (second emission surface 332) when light flux controlling member 300 is viewed in plan view. In the present embodiment, flange 340 has a surface parallel to optical axis OA.

[Simulation]

Figure 6:
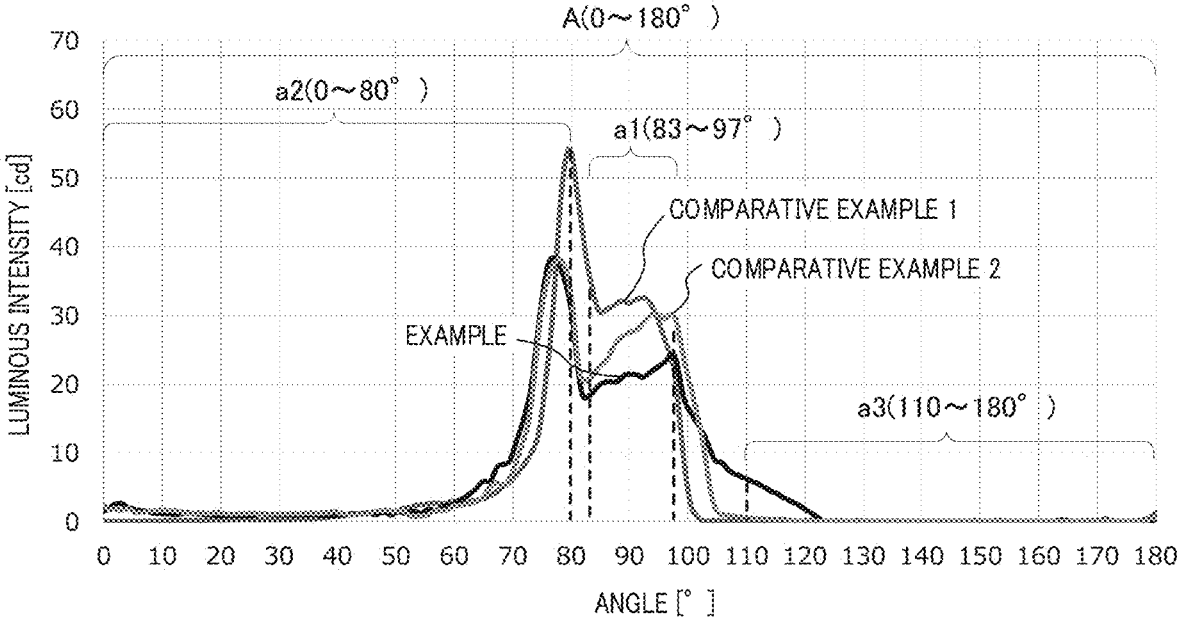
FIG. 6 is a graph illustrating the light distribution curves of an example and comparative examples.

FIG. 6 illustrates light distribution curves obtained when the simulation is performed for the light emitting devices of the example and the comparative examples 1 and 2. Table 1 shows the ratios of respective integral values obtained from the light distribution curves. The light emitting devices of comparative examples 1 and 2 each include a light flux controlling member simulating a conventional light flux controlling member. As can be seen from Table 1, in the light emitting device of the example, the incidence surface, the total reflecting surface and the emission surface of the light flux controlling member are configured so as to satisfy condition 1, but the light emitting devices of comparative examples 1 and 2 do not satisfy condition 1.

The light emitting device of the example is light emitting device 200 including light flux controlling member 300 described above. Comparative examples 1 and 2 are also light emitting devices each including a reflecting lens that includes a total reflecting surface as a light flux controlling member, but do not satisfy condition 1.

TABLE 1

| | Example | Comparative Example 1 | Comparative Example 2 |
|---|---|---|---|
| Condition 1: a1/A = 0.23 to 0.38 | 0.31 | 0.47 | 0.39 |
| Condition 2: a2/A = 0.60 or less | 0.42 | 0.34 | 0.39 |
| Condition 3: a3/A = 0.40 or less | 0.05 | 0 | 0.01 |

Figure 7A:
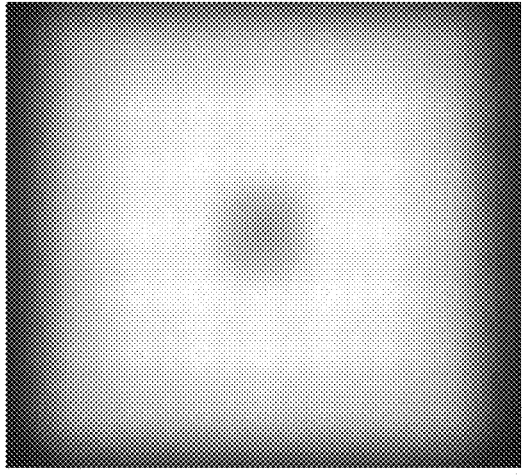
FIG. 7A illustrates the light and dark contrast of the surface light source device according to the example.
Figure 7B:
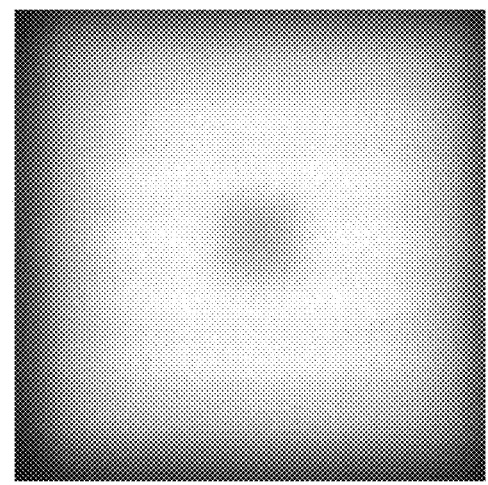
FIGS. 7B and 7C illustrate the light and dark contrast of the surface light source devices according to the comparative examples.
Figure 7C:
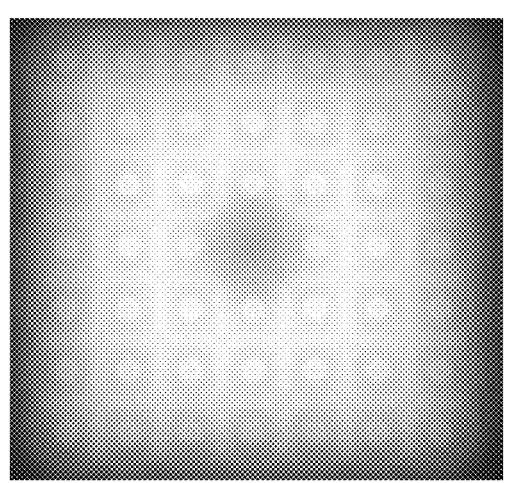

FIGS. 7A to 7C illustrate the contrast between light and dark in the surface light source devices including the light emitting devices of the example and comparative examples 1 and 2, which have the light distribution curves described above. Specifically, in FIGS. 7A to 7C, seven light emitting devices in the horizontal direction and seven light emitting devices in the vertical direction, namely a total of 49 light emitting devices are disposed. Then, the drawings show the contrast between light and dark when only one light emitting device in the center is turned off and all other light emitting devices are turned on. The center-to-center distance (P) of adjacent light emitting devices is set to be 135 mm, and the distance (H) between the surface (substrate) on which the light emitting device is disposed and the back surface of the light diffusion plate is set to be 15 mm.

Condition 1 is a condition for preventing light from a turned-on light emitting device—that is adjacent to the turned-off light emitting device—from reaching the light diffusion plate above the turned-off light emitting device, thereby improving the contrast between light and dark. Here, when the light of the turned-on light emitting device is controlled to satisfy condition 1, the light is prevented from reaching the light diffusion plate above an adjacent turned-off light emitting device, and instead the light is deflected toward other regions. A bright part is more likely to be generated in the light diffusion plate above the turned-on light emitting device when the deflected light reaches the light diffusion plate is polarized. It is preferable to satisfy condition 2 and/or condition 3 in order to prevent the generation of such a bright part. Thus, it is possible to obtain a satisfactory contrast between light and dark, and also to obtain a surface light source device with a high level of uniformity in the lighting region illuminated by the turned-on light emitting device.

That is, the generation of a bright part is reduced by condition 2, which is a2/A being 0.60 or less, and the generation of a bright part is reduced by condition 3, which is a3/A being 0.40 or less. Here, when a2/A is too small, a dark part may be generated. Therefore, it is preferable that a2/A is 0.15 or more in order to reduce the generation of a dark part.

Figure 8A:
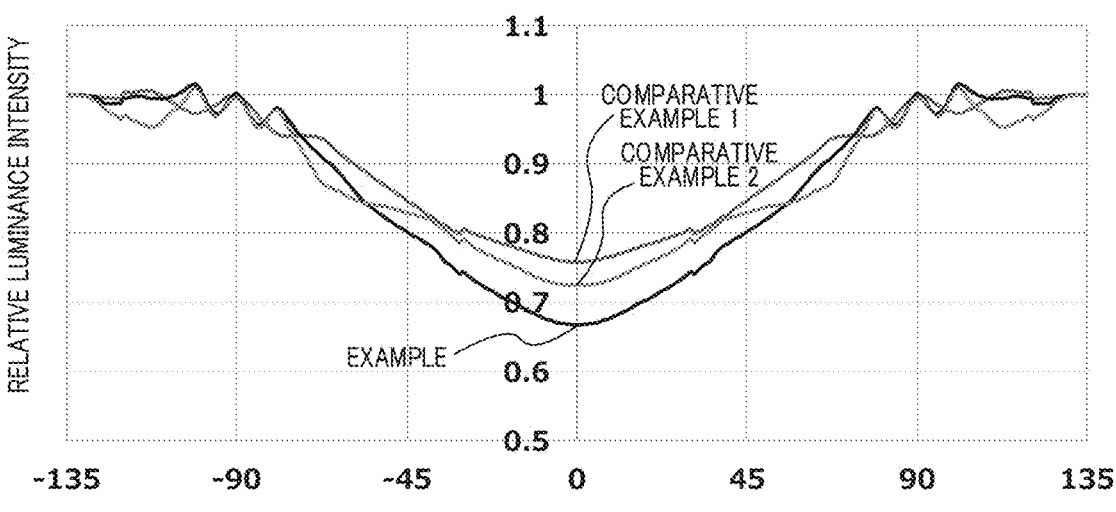
FIG. 8A is a graph illustrating the light and dark contrast in FIGS. 7A to 7C.

FIG. 8A is a graph illustrating the light and dark contrast in the surface light source devices in FIGS. 7A to 7C. Specifically, FIG. 8A illustrates the magnitude of luminance in a cross section that includes the optical axis of the turned-off light emitting device in the middle and the optical axes of the two turned-on light emitting devices on either side of the turned-off light emitting device, in FIGS. 7A to 7C.

More specifically, the horizontal axis of the graph in FIG. 8A represents the distance in the horizontal direction (the surface direction of the light diffusion plate), and the vertical axis represents the relative luminance intensity on the surface of the light diffusion plate of the surface light source device. That is, the position of 0 mm on the horizontal axis in FIG. 8 corresponds to the position on the surface of the light diffusion plate intersecting the optical axis of the turned-off light emitting device (light emitting element) in the middle, and −135 mm and 135 mm respectively correspond to the positions on the surface of the light diffusion plate intersecting optical axis OA of the turned-on light emitting devices (light emitting elements) on either side of the turned-off light emitting device. For comparison, luminance is indicated as a relative value with the luminance on the surface of the light diffusion plate at −135 mm and 135 mm being as 1.

In the example, the luminance directly above the unlit light emitting device is low, and the luminance directly above the adjacent turned-on light emitting device is high as can be seen from FIGS. 7A to 7C and FIG. 8A, achieving satisfactory light and dark contrast. That is, it is possible to exhibit satisfactory local dimming. On the other hand, in comparative examples 1 and 2, the difference between the levels of the luminance is small, and a satisfactory light and dark contrast cannot be achieved. That is, it is not possible to exhibit satisfactory local dimming. This is because the example satisfies condition 1, but comparative examples 1 and 2 do not satisfy condition 1. Specifically, it is because by satisfying condition 1, the light from the turned-on light emitting device in the example is prevented from reaching directly above the light emitting device turned off.

Figure 8B:
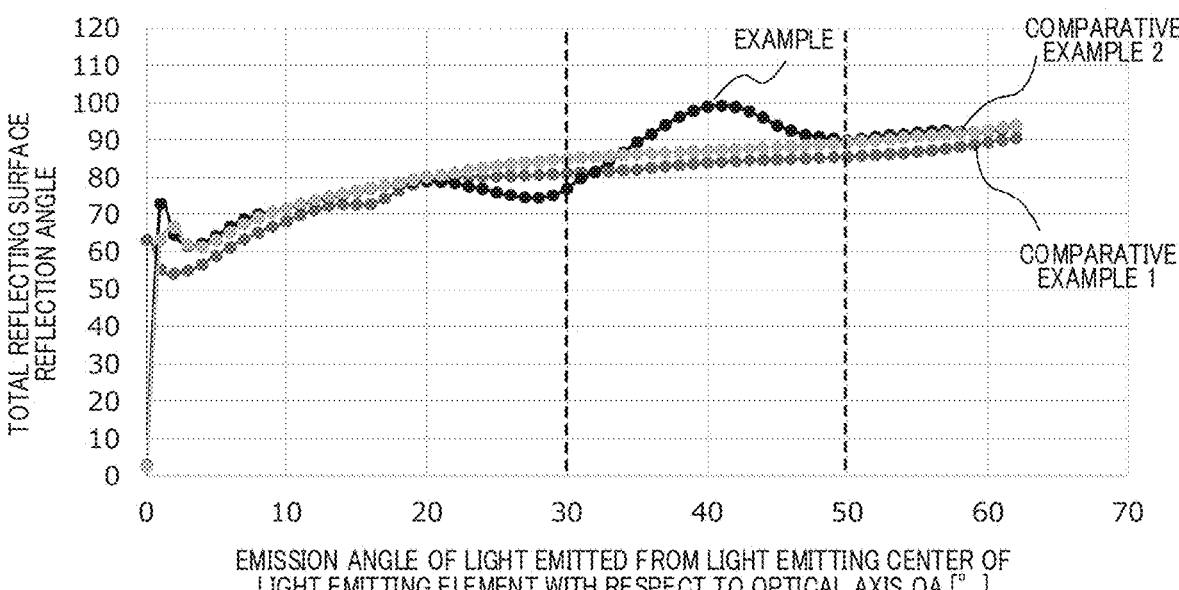
FIG. 8B is a graph illustrating the angles of light reflected by the reflecting surfaces in the light emitting devices of the example and comparative examples.
Figure 9A:
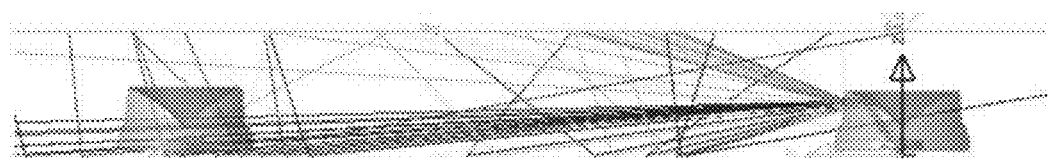
FIG. 9A illustrates optical paths in a light emitting device of the example.
Figure 9B:
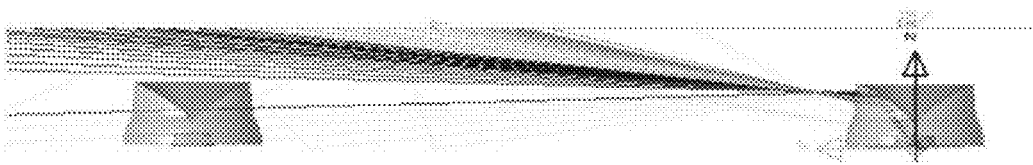
FIG. 9B illustrates optical paths in a light emitting device of the comparative example.

FIG. 8B is a graph illustrating the relationship between the angle (with respect to optical axis OA) of the light emitted from the light emitting center of the light emitting element in the light emitting device for each of the example and the comparative examples 1 and 2, and the angle (with respect to optical axis OA) of the light reflected by the reflecting surface (total reflecting surface reflection angle). Further, FIG. 9A illustrates optical paths in the light emitting device of the example, and FIG. 9B illustrates optical paths in the light emitting device of comparative example 1.

As can be seen from FIG. 8B, in the example, at least a portion of light emitted from the light emitting center of the light emitting element—the light emitted at an angle of 30° to 50° with respect to optical axis OA—is reflected by the total reflecting surface so that an angle of the reflected portion with respect to optical axis OA is 90° or more (in the direction toward the bottom side of the light emitting device). As a result, in the example, as illustrated in FIG. 9A, more light travels toward the bottom side of the light emitting device, and light reaching the light diffusion plate located above the adjacent light emitting device can be reduced. On the other hand, in the comparative examples 1 and 2, light emitted from the light emitting center of the light emitting element at an angle of 30° to 50° with respect to optical axis OA is reflected such that the total reflecting surface reflection angle is less than 90° (in the direction toward the upper portion of the light emitting device). As a result, in the comparative example 1, more light reaches the light diffusion plate located above the adjacent light emitting device, as illustrated in FIG. 9B.

In the example, the total reflecting surface reflects light in the manner described above, which is one of the factors that achieves a light distribution that satisfies condition 1 (see Table 1). The light emitting device configured to satisfy condition 1 (light flux controlling member) is not limited to the example. The light distribution for achieving condition 1 may be achieved by appropriately adjusting the shapes of the incidence surface, the reflecting surface, and the emission surface of a light flux controlling member. Therefore, the present invention also includes a light emitting device including a light flux controlling member configured to achieve condition 1 by appropriately combining an incidence surface, a reflecting surface, and an emission surface having shapes different from those in the above example.

Figure 1A:
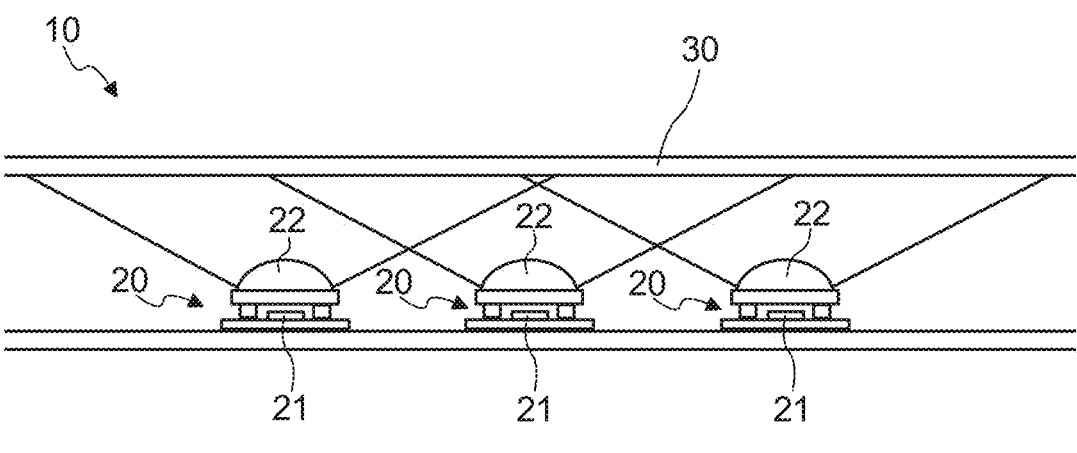
FIG. 1A illustrates a conventional surface light source device.
Figure 1B:
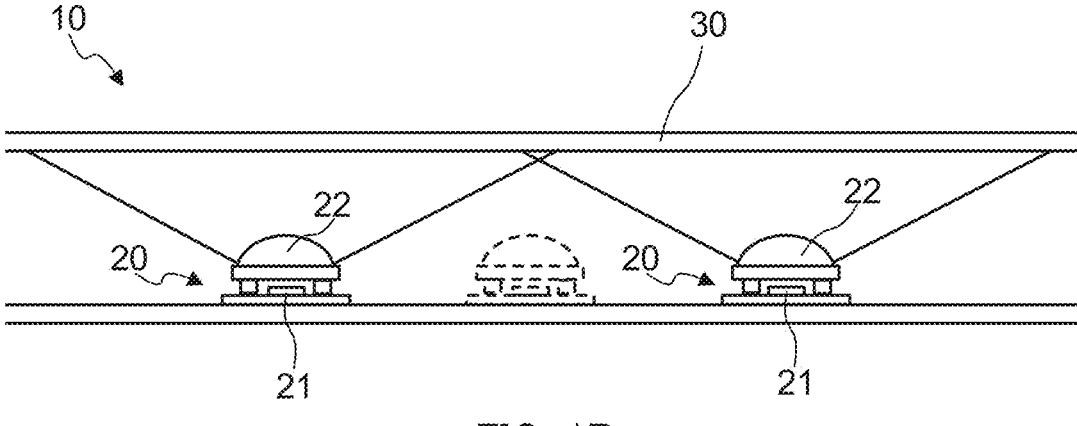
FIG. 1B illustrates a state in which a light emitting device is removed from the conventional surface light source device.
Figure 1C:
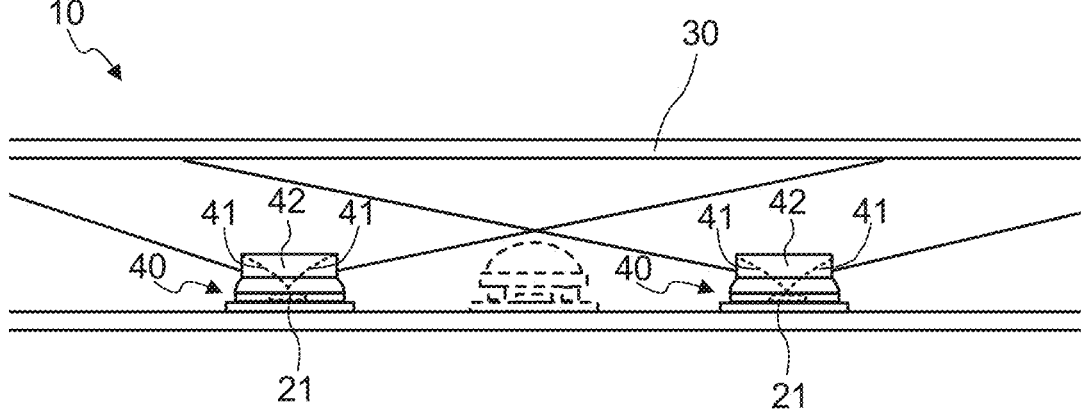
FIG. 1C illustrates a state in which a light emitting device including a light flux controlling member that includes a reflecting surface is used in the surface light source device in FIG. 1B.

Further, in the example, light spreads over a wide range by satisfying conditions 2 and 3, thereby reducing the generation of a bright part. That is, by satisfying condition 2 in addition to condition 1, light spreads over a wider range than with light emitting device 20 including light flux controlling member (refractive lens) 22 as illustrated in FIG. 1A, and the dark part above a turned-off light emitting device is made more prominent, thereby obtaining a satisfactory light and dark contrast. Further, by satisfying condition 3, the following is prevented: light reflected by a member such as a reflective sheet and returns to the vicinity directly above the light flux controlling member, and the vicinity directly above from becomes excessively bright.

INDUSTRIAL APPLICABILITY

The light emitting device of the present invention can be applied to, for example, a surface light source device used such as a backlight and general illumination of a liquid crystal display device.

REFERENCE SIGNS LIST 10, 100 Surface light source device
30, 120 Light diffusion plate
20, 40, 200 Light emitting device
21, 220 Light emitting element
22, 42, 300 Light flux controlling member
41, 320 Total reflecting surface
100' Display device
102 Display member
110 Housing
112 Bottom plate
114 Top plate
210 Substrate
221 Light emitting surface
310 Incidence surface
311 First incidence surface
312 Second incidence surface
330 Emission surface
331 First emission surface
332 Second emission surface
340 Flange

What is claimed is:

1. A light emitting device comprising a light emitting element and a light flux controlling member for controlling light from the light emitting element, wherein the light flux controlling member includes an incidence surface for allowing incidence of the light from the light emitting element, the incidence surface being disposed to face a light emitting surface of the light emitting element, a total reflecting surface for totally reflecting, in a direction away from an optical axis of the light emitting element, the light incident on the incidence surface, and an emission surface for emitting the light reflected by the total reflecting surface, and in a light distribution curve indicating a far-field light distribution of the light emitting device, when an angle of a direction along the optical axis is 0°, an integral value of a luminous intensity in a range of 0° to 180° is A, and an integral value of a luminous intensity in a range of 83° to 97° is a1, a1/A is from 0.23 to 0.38.

2. The light emitting device according to claim 1, wherein, in the light distribution curve, when an integral value of a luminous intensity in a range of 0° to 80° is a2, a2/A is 0.60 or less.

3. The light emitting device according to claim 1, wherein, in the light distribution curve, when an integral value of a luminous intensity in a range of 110° to 180° is a3, a3/A is 0.40 or less.

4. The light emitting device according to claim 1, wherein at least a portion of light emitted at an angle of 30° to 50° with respect to the optical axis from a light emitting center of the light emitting element is reflected by the total reflecting surface so that an angle of the reflected portion with respect to the optical axis is 90° or more.

5. A surface light source device, comprising:

a substrate;

a plurality of light emitting devices disposed on the substrate; and a light diffusion plate for diffusing light from the plurality of light emitting devices, wherein the plurality of light emitting devices include the light emitting device according to claim 1.

6. The surface light source device according to claim 5, wherein when a distance between the substrate and the light diffusion plate is H, and a center-to-center distance between adjacent light emitting devices among the plurality of light emitting devices is P, H is more than 7 mm, and H/P is 0.15 to 0.25.

7. A display device comprising the surface light source device according to claim 5.

* * * * *